(12) United States Patent
Ishikawa

(10) Patent No.: US 8,017,519 B2
(45) Date of Patent: Sep. 13, 2011

(54) SEMICONDUCTOR DEVICE AND MANUFACTURING METHOD THEREOF

(75) Inventor: Hiraku Ishikawa, Sendai (JP)

(73) Assignee: Tokyo Electron Limited, Tokyo (JP)

( * ) Notice: Subject to any disclaimer, the term of this patent is extended or adjusted under 35 U.S.C. 154(b) by 56 days.

(21) Appl. No.: 12/521,397

(22) PCT Filed: Dec. 26, 2007

(86) PCT No.: PCT/JP2007/074979
§ 371 (c)(1),
(2), (4) Date: Jun. 26, 2009

(87) PCT Pub. No.: WO2008/081824
PCT Pub. Date: Jul. 10, 2008

(65) Prior Publication Data
US 2010/0323516 A1      Dec. 23, 2010

(30) Foreign Application Priority Data

Dec. 28, 2006   (JP) .................................. 2006-355132
May 16, 2007    (JP) .................................. 2007-130142

(51) Int. Cl.
*H01L 21/44* (2006.01)
(52) U.S. Cl. ........ 438/655; 438/618; 438/652; 438/653; 438/654; 438/656; 438/682; 438/683; 438/687; 438/688
(58) Field of Classification Search .................. 438/618, 438/652–656, 682–683, 687–688
See application file for complete search history.

(56) References Cited

U.S. PATENT DOCUMENTS

| | | | |
|---|---|---|---|
| 6,331,481 B1 * | 12/2001 | Stamper et al. | 438/626 |
| 6,333,248 B1 * | 12/2001 | Kishimoto | 438/586 |
| 6,358,832 B1 * | 3/2002 | Edelstein et al. | 438/612 |
| 6,372,628 B1 * | 4/2002 | Matsubara et al. | 438/622 |
| 6,660,634 B1 * | 12/2003 | Ngo et al. | 438/687 |
| 2003/0036280 A1 * | 2/2003 | Jain et al. | 438/700 |
| 2004/0137721 A1 * | 7/2004 | Lim et al. | 438/638 |
| 2004/0266171 A1 * | 12/2004 | Aoki et al. | 438/622 |
| 2005/0014360 A1 * | 1/2005 | Yu et al. | 438/622 |
| 2006/0231524 A1 * | 10/2006 | Liu et al. | 216/41 |

FOREIGN PATENT DOCUMENTS

| | | |
|---|---|---|
| JP | 09-321045 A | 12/1997 |
| JP | 2001-319928 A | 11/2001 |
| JP | 2004-193544 A | 7/2004 |
| JP | 2005-050859 A | 2/2005 |
| JP | 2006-253504 A | 9/2006 |
| JP | 2006-294941 A | 10/2006 |
| JP | 2006-324584 A | 11/2006 |
| WO | 2005-087974 A2 | 9/2005 |

OTHER PUBLICATIONS

International Search Report for PCT/JP2007/074979 dated Mar. 18, 2008. Tatsuyuki Saito, et al, "A Novel Copper Interconnection Technology Using Self Aligned Metal Capping Method," Device Development Center, Hitachi, Ltd., p. 15-17, 2001 IEEE.
Korean Office action for 10-2009-7014781 dated Feb. 17, 2011.

\* cited by examiner

*Primary Examiner* — Kevin M Picardat
*Assistant Examiner* — Bac Au
(74) *Attorney, Agent, or Firm* — Pearne & Gordon LLP

(57) ABSTRACT

Disclosed is a semiconductor device including: a substrate; a wiring layer formed on the substrate and made of copper or a copper alloy; a copper diffusion barrier film formed on the wiring layer and made of an amorphous carbon film formed by CVD using a processing gas containing a hydrocarbon gas; and a low-k insulating film formed on the copper diffusion barrier film.

19 Claims, 12 Drawing Sheets

A

B

C

D

E

F

A

B

C

SEMICONDUCTOR DEVICE AND MANUFACTURING METHOD THEREOF

TECHNICAL FIELD

The present invention relates to a semiconductor device having an amorphous carbon film on a substrate, and also relates to a manufacturing method of the semiconductor device.

BACKGROUND ART

Recently, in a manufacturing process of a semiconductor device, a design rule is getting miniaturized. Along with such a trend, an organic film having a low dielectric constant, i.e., a low-k film is used as an interlayer insulating film and Cu having a lower electric resistance than a traditionally used Al is utilized in a wiring layer in order to achieve a high speed operation.

When Cu wiring multi-layers are formed while interposing interlayer insulating films therebetween, a low-k film made of, e.g., polymer is formed as an interlayer insulating film on, e.g., a semiconductor wafer (hereinafter, simply referred to as a 'wafer') provided with a certain layer, and via etching is performed by using a resist layer or the like as a mask. Thereafter, the resist and the polymer are removed, and then a sacrificial layer is formed, and trench etching is performed by using a resist layer as a mask. Then, the resist and the polymer are removed again, and dry asking and cleaning are performed. Then, the sacrificial film and a stopper layer are removed by etching, and a Cu wiring layer and a plug are formed.

Thereafter, the Cu wiring layer is polished by CMP (Chemical Mechanical Polishing). Subsequently, a Cu oxide film on a surface thereof is removed by a plasma process or a wet process. Then, a low-k film is additionally formed thereon as an interlayer insulating film.

In such a case, since Cu tends to be diffused readily, Cu may be diffused into the low-k film due to a temperature rise in the process of forming the low-k film. This has an adverse influence on a device. In this regard, there has been proposed a technology for preventing a diffusion of Cu by forming any one of SiN, $SiO_2$, SiC, SiCO and SiCN on the entire surface of the wafer as a Cu diffusion barrier film by plasma CVD after performing CMP (see, for example, T. Saito et al. in proceeding of IITC, 2001, pp. 15 to 17).

However, since these materials have high dielectric constants (for example, SiN has a relative dielectric constant of about 7), the effect thereof decreases even if a low-k film having a relative dielectric constant of about 2 to 3 is used as an interlayer insulating film.

DISCLOSURE OF THE INVENTION

In view of the foregoing, the present invention provides a semiconductor device capable of preventing a diffusion of Cu and suppressing an increase of an interlayer dielectric constant, and a manufacturing method of the semiconductor device.

Further, the present invention also provides a storage medium storing therein a program for implementing the semiconductor device manufacturing method.

In accordance with a first aspect of the present invention, there is provided a semiconductor device including: a substrate; a wiring layer formed on the substrate and made of copper or a copper alloy; a copper diffusion barrier film formed on the wiring layer and made of an amorphous carbon film formed by CVD using a processing gas containing a hydrocarbon gas; and a low-k insulating film formed on the copper diffusion barrier film.

In the above-stated aspect, the amorphous carbon film is formed on the wiring layer made of Cu or the Cu alloy, as the Cu diffusion barrier film, by the CVD process using the processing gas containing the hydrocarbon gas, and the low-k insulating film is formed on the amorphous carbon film. The amorphous carbon film, which is formed as above, functions as a barrier for preventing a diffusion of Cu from the wiring layer into the low-k insulating film. Further, a relative dielectric constant of the amorphous carbon film is about 2.6, which is lower than that of SiC used as a conventional barrier film material, so that an increase of a dielectric constant between the wiring layers can be suppressed. Further, such an amorphous carbon film has a higher adhesivity to the wiring layer than the conventional SiC film or the like.

In accordance with a second aspect of the present invention, there is provided a semiconductor device including: a substrate; a wiring layer formed on the substrate and made of copper or a copper alloy; a metal film formed on the wiring layer; a copper diffusion barrier film formed on the metal film and made of an amorphous carbon film formed by using a processing gas containing a hydrocarbon gas; and a low-k insulating film formed on the copper diffusion barrier film.

When a wafer processing is performed at a temperature of about 400° C. or higher after the amorphous carbon film is formed on the wiring layer, the amorphous carbon film is reduced by a catalytic reaction between the wiring layer and the amorphous carbon film. In the above-stated aspect, however, since the metal film is formed between the wiring layer and the amorphous carbon film, the decrease of the amorphous carbon film thickness can be suppressed.

In the second aspect of the present invention, the metal film may have a thickness ranging from about 1 to 5 nm. Further, for example, the metal film forms an alloy with the underlying wiring layer. Further, for example, the metal film contains at least one of Co, Ni, W, Al, In, Sn, Mn, Zn and Zr.

In accordance with a third aspect of the present invention, there is provided a semiconductor device including: a substrate; a wiring layer formed on the substrate and made of copper or a copper alloy; a silicide film formed on the wiring layer; a copper diffusion barrier film formed on the silicide film and made of an amorphous carbon film formed by using a processing gas containing a hydrocarbon gas; and a low-k insulating film formed on the copper diffusion barrier film.

In the above-stated aspect, by forming the silicide film instead of the metal film, the decrease of the amorphous carbon film thickness can be suppressed. Further, since the silicide film has a higher selectivity for film formation than the metal film, it can be selectively formed on the wiring layer. Moreover, the silicide film can be formed simply by supplying the Si-containing gas onto the wiring layer at a low temperature. Therefore, the formation of the silicide film and the formation of the amorphous carbon film can be carried out in-situ while maintaining a vacuum state.

In the third aspect of the present invention, the silicide film may be formed through a reaction between Si and the copper in the wiring layer by supplying a Si-containing gas to the wiring layer. Further, it is desirable that the silicide film has a thickness equal to or less than about 100 nm.

In the first to third aspects, the copper diffusion barrier film may have a thickness equal to or less than about 5 nm. Further, for example, the copper diffusion barrier film is made of an amorphous carbon film formed by using a processing gas containing an acetylene gas and a hydrogen gas. In addition, the copper diffusion barrier film is made of an amorphous carbon film formed by using a processing gas containing a gas having a chemical formula of $C_4H_6$, for example. In this case, for example, the gas having the chemical formula of $C_4H_6$ is at least one of 2-butyne and butadiene.

In accordance with a fourth aspect of the present invention, there is provided a semiconductor device manufacturing method including: forming a wiring layer made of copper or a copper alloy on a substrate; forming, on the wiring layer, an amorphous carbon film as a copper diffusion barrier film by CVD using a processing gas containing a hydrocarbon gas; and forming a low-k insulating film on the copper diffusion barrier film.

In the above-stated aspect, the amorphous carbon film is formed on the wiring layer made of Cu or the Cu alloy, as the Cu diffusion barrier film, by the CVD process using the processing gas containing the hydrocarbon gas, and the low-k insulating film is formed on the amorphous carbon film. The amorphous carbon film, which is formed as above, functions as a barrier for preventing a diffusion of Cu from the wiring layer into the low-k insulating film. Further, a relative dielectric constant of the amorphous carbon film is about 2.6, which is lower than that of SiC used as a conventional barrier film material, so that an increase of a dielectric constant between the wiring layers can be suppressed. Further, such an amorphous carbon film has a higher adhesivity to the wiring layer than the traditional SiC film or the like.

Further, in accordance with a fifth aspect of the present invention, there is provided a semiconductor device manufacturing method including: forming a wiring layer made of copper or a copper alloy on a substrate; forming a metal film on the wiring layer; forming, on the metal film, an amorphous carbon film as a copper diffusion barrier film by CVD using a processing gas containing a hydrocarbon gas; and forming a low-k insulating film on the copper diffusion barrier film.

In the above-stated aspect, since the metal film is formed between the wiring layer and the amorphous carbon film, a thickness decrease of the amorphous carbon film can be suppressed.

In the fifth aspect of the present invention, the metal film may be formed to have a thickness ranging from about 1 to 5 nm. Further, for example, the metal film forms an alloy with the underlying wiring layer. Further, for example, the metal film contains at least one of Co, Ni, W, Al, In, Sn, Mn, Zn and Zr. Further, the metal film may be formed by a plating process or a CVD process. If the metal film is formed by a plating process, the metal film contains at least one of W, Co and Ni, for example. If the metal film is formed by a CVD process, the metal film contains at least one of W and Al, for example.

Further, in accordance with a sixth aspect of the present invention, there is provided a semiconductor device manufacturing method including: forming a wiring layer made of copper or a copper alloy on a substrate; forming, on the wiring layer, a silicide film through a reaction between the copper in the wiring layer and silicon by supplying a silicon-containing gas; forming, on the silicide film, an amorphous carbon film as a copper diffusion barrier film by CVD using a processing gas containing a hydrocarbon gas; and forming a low-k insulating film on the copper diffusion barrier film.

In the above-stated aspect, by forming the silicide film instead of the metal film, the decrease of the amorphous carbon film thickness can be suppressed. Further, since the silicide film has a higher selectivity for film formation than the metal film, it can be selectively formed on the wiring layer. Moreover, the silicide film can be formed simply by supplying the Si-containing gas onto the wiring layer at a low temperature. Therefore, the formation of the silicide film and the formation of the amorphous carbon film can be carried out in-situ while maintaining a vacuum state.

In the sixth aspect of the present invention, it is desirable that the silicide film is formed to have a thickness equal to or less than about 100 nm. Further, it is desirable that the silicon-containing gas is selected from a group consisting of a $SiH_4$ gas, a $Si_2H_6$ gas, a $Si(CH_3)_4$ gas, a $SiH(CH_3)_3$ gas, a $SiH_2(CH_3)_2$ gas, a $SiH_3(CH_3)$ gas and a $(SiH_3)_3N$ gas. Further, it is desirable that each of the process of forming the silicide film and the process of forming the amorphous carbon film is implemented by a vacuum processing, and a vacuum state is maintained between the process of forming the silicide film and the process of forming the amorphous carbon film. In this case, the process of forming the silicide film and the process of forming the amorphous carbon film may be performed in the same chamber.

In the fourth to sixth aspects, it is desirable to further include a process of removing an oxide film on a surface of the wiring layer.

In the above-stated aspects, after forming the wiring layer, a native oxide film on the surface of the wiring layer is removed to be cleaned, so that the characteristic of a semiconductor device can be further improved.

In accordance with a seventh aspect of the present invention, there is provided a semiconductor device manufacturing method including: forming a wiring layer made of copper or a copper alloy on a substrate; removing an oxide film on a surface of the wiring layer; forming, on the wiring layer, a silicide film by a reaction between the copper in the wiring layer and silicon by way of supplying a silicon-containing gas; and forming, on the silicide film, an amorphous carbon film as a copper diffusion barrier film by CVD using a processing gas containing a hydrocarbon gas, wherein all of the processes are implemented by a vacuum processing, and a vacuum state is maintained between the processes.

In the above-stated aspect, it is possible to fabricate a semiconductor device very efficiently without being affected by oxygen or moisture.

In the seventh aspect of the present invention, the process of removing the oxide film on the surface of the wiring layer, the process of forming the silicide film and the process of forming the amorphous carbon film may be performed in the same chamber.

In the fourth to seventh aspects, the amorphous carbon film may be formed to allow the copper diffusion barrier film to have a thickness equal to or less than about 5 nm. Further, the processing gas contains, for example, an acetylene gas and a hydrogen gas. In addition, the processing gas contains, for example, a gas having a chemical formula of $C_4H_6$. In this case, the gas having the chemical formula of $C_4H_6$ is, for example, at least one of 2-butyne and butadiene.

In accordance with an eighth aspect of the present invention, there is provided a storage medium storing therein a program for controlling, when executed on a computer, a semiconductor device manufacturing system, wherein the program controls the semiconductor device manufacturing system on the computer so as to implement a semiconductor device manufacturing method as described above.

BEST MODE FOR CARRYING OUT THE INVENTION

Hereinafter, embodiments of the present invention will be described with reference to the accompanying drawings.

FIGS. 1A to 1F are process diagrams for describing a manufacturing method of a semiconductor device in accordance with a first embodiment of the present invention.

Figure 1:
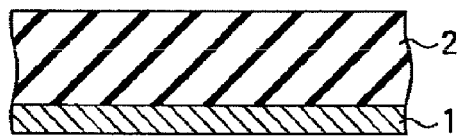
FIGS. 1A to 1F are process diagrams for describing a semiconductor device manufacturing method in accordance with a first embodiment of the present invention.
Figure 1:
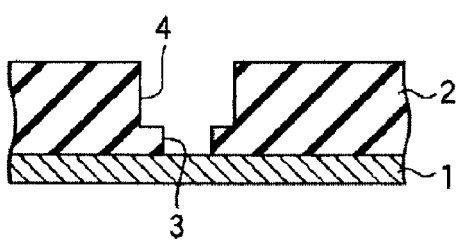
Figure 1:
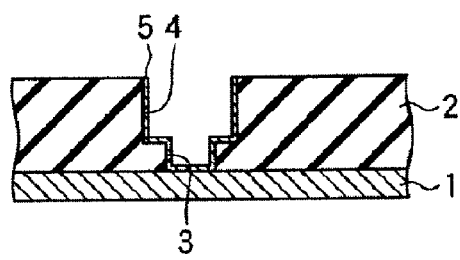
Figure 1:
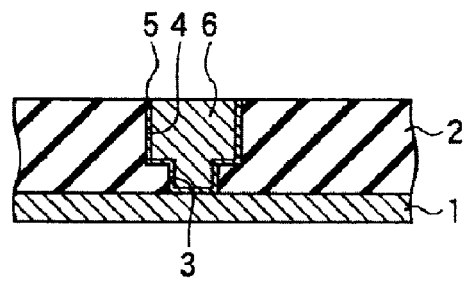
Figure 1:
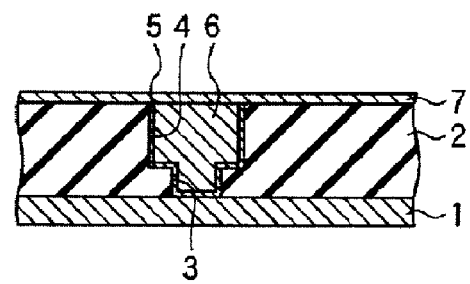
Figure 1:
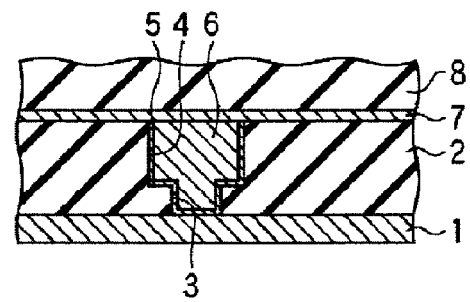

In the present embodiment, first, a low dielectric constant insulating film (low-k film) 2 made of, e.g., polymer is formed on an underlying wiring 1 as an interlayer insulating film, as shown in FIG. 1A. This film formation can be carried out by spin coating or CVD (Chemical Vapor Deposition).

Then, as illustrated in FIG. 1B, via etching is performed by using a resist layer (not shown) as a mask. Then, after the resist and the polymer are removed, a sacrificial layer (not shown) is formed. Subsequently, trench etching is performed by using a resist layer as a mask. Then, the resist and the polymer are removed again, and dry asking and cleaning are performed, and then the sacrificial layer and a stopper layer (not shown) are also removed by etching. As a result, a via hole 3 and a trench 4 are formed.

Thereafter, as shown in FIG. 1C, a barrier metal film 5 is formed in the via hole 3 and the trench 4.

Then, as illustrated in FIG. 1D, the via hole 3 and the trench 4 are filled up through a Cu plating or the like, so that a Cu wiring layer 6 is formed therein. The Cu wiring layer 6 is then polished by a CMP or the like. Here, it is desirable to remove a native oxide film on a surface of the Cu wiring layer 6 so as to improve characteristics of a semiconductor device to be fabricated. Though the removal of the native oxide film can be carried out by a plasma process or a wet cleaning process using dilute hydrofluoric acid, it is more desirable to use a reduction gas such as a $H_2$ gas or the like. Besides the $H_2$ gas, $NH_3$ (ammonia) or the like can also be used as the reduction gas.

Then, as shown in FIG. 1E, an amorphous carbon film 7 is formed by CVD using a processing gas containing a hydrocarbon gas. The formation of this amorphous carbon film will be described later in detail.

Subsequently, as illustrated in FIG. 1F, a low-k film 8 is formed on the amorphous carbon film 7 by spin coating or CVD. Then, a post-process is performed by a typical method (process), whereby a desired semiconductor device is obtained.

In the semiconductor device having the above-described structure, the amorphous carbon film 7 formed by the CVD using the processing gas containing the hydrocarbon gas serves as a Cu diffusion barrier for preventing a diffusion of Cu from the Cu wiring layer 6 into the low-k film 8.

In a conventional structure, SiN, SiC or SiCN has been used for a Cu diffusion barrier. However, these materials have high dielectric constants (for example, SiN, SiC and SiCN have dielectric constants of about 7, 3.6 and 3.0, respectively). Accordingly, there occurs a problem that the effect thereof decreases even when the low-k film having a dielectric constant of about 2 to 3 is used as the interlayer insulating film.

In contrast, the amorphous carbon film 7 formed by the CVD using the processing gas containing the hydrocarbon gas has a sufficient barrier function, and its dielectric constant is about 2.6, much smaller than that of the conventional barrier film material, e.g., SiC or the like. Therefore, an increase of a dielectric constant between wiring layers can be suppressed.

Further, since the amorphous carbon film 7 formed by CVD using the processing gas containing the hydrocarbon gas is a dense bulk film, adhesivity to the wiring layer can be enhanced, as compared to the traditional porous SiC film or the like.

Now, an example system for implementing the method in accordance with the first embodiment will be explained. Fig. is a schematic configuration view of a semiconductor device manufacturing system used in the semiconductor device manufacturing method in accordance with the first embodiment of the present invention.

The semiconductor device manufacturing system is provided with a processing unit 100 including an amorphous carbon film forming apparatus 101, a Cu film forming apparatus 102 and a low-k film forming apparatus 103. Further, this semiconductor device manufacturing system is provided with a main control unit 110 including a process controller 111, a user interface 112 and a storage unit 113. Further, a W can be transferred between the apparatuses of the processing unit 100 by an operator, a non-illustrated transfer mechanism, or the like.

Each apparatus of the processing unit 100 is connected to and controlled by the process controller 111 which is provided with a CPU. The process controller 111 is connected to the user interface 112 including a keyboard, a display, or the like. For example, the keyboard is used by a process manager to input a command for managing each apparatus of the processing unit 100. For example, the display is used to visualize and display an operational status of each apparatus of the processing unit 100. Further, the process controller 111 is connected to the storage unit 113. The storage unit 113 stores therein control programs for implementing various processes performed by the processing unit 100 under the control of the process controller 111, or recipes in which processing condition data or the like is stored.

If necessary, in response to an instruction from the user interface 112, a recipe is retrieved from the storage unit 113 and implemented by the process controller 111. Accordingly, desired processes are performed by the processing unit 100 under the control of the process controller 111. Further, the recipe may be stored in a storage medium of the storage unit 113. The storage medium may be a hard disk or a semiconductor memory, or the recipe may be stored in a portable storage medium such as a CD-ROM, a DVD, or the like and may be set in a certain position of the storage unit 113. Alternatively, it is also possible to receive the recipe from an external apparatus through, e.g., a dedicated line and use it on-line whenever necessary.

Further, though all controls can be performed by the main control unit 110, it may be also possible to set the main control unit 110 to perform only the overall control, while setting subordinate control units provided for each apparatus or each apparatus group to perform subordinate controls.

Furthermore, the amorphous carbon film forming apparatus 101 is an apparatus for forming an amorphous carbon film on the W by a CVD method using a processing gas containing a hydrocarbon gas, as will be described in detail later.

Further, the Cu film forming apparatus 102 is an apparatus for burying Cu in a wiring groove, or the like, and it may be, for example, a plating apparatus. Alternatively, it may be an apparatus for filling up a wiring groove by a PVD. In such a case, a Cu alloy can be used as a wiring material.

Further, the low-k film forming apparatus 103 is an apparatus for forming a low-k film after forming the amorphous carbon film serving as a Cu diffusion barrier film. An SOD (Spin On Dielectric) apparatus for forming the low-k film by spin coating using an SOD method or a CVD apparatus can be used as the low-k film forming apparatus 103.

Figure 3:
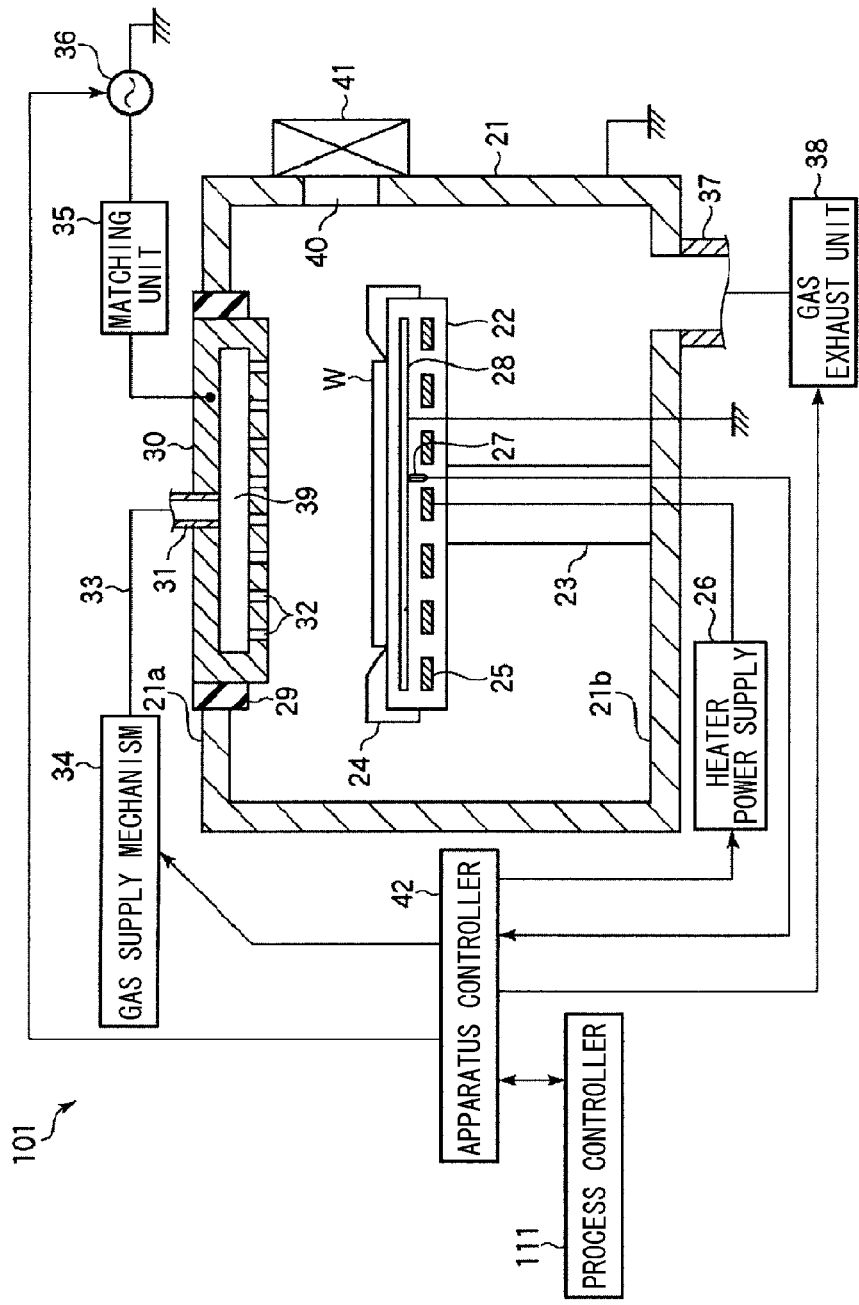
FIG. 3 is a cross sectional view of an example of an amorphous carbon film forming apparatus used in the semiconductor device manufacturing system of FIG. 2.

Now, the amorphous carbon film forming apparatus 101 having an important function in the present embodiment will be described in detail. FIG. 3 is a cross sectional view showing an example of the amorphous carbon film forming apparatus used in the semiconductor device manufacturing system. The amorphous carbon film forming apparatus 101 has a substantially cylindrical chamber 21.

A susceptor 22 for horizontally supporting a wafer W, which is a target object to be processed, is disposed within the chamber 21. The susceptor 22 is supported by a cylindrical supporting member 23 installed at a central bottom portion of the chamber 21. A guide ring 24 for guiding the W is installed at an outer periphery portion of the susceptor 22. Further, a heater 25 is embedded in the susceptor 22 to heat the W up to a certain temperature by a power supplied from a heater power supply 26. A thermocouple 27 is also embedded in the susceptor 22. An output from the heater power supply 26 to the heater 25 is controlled based on a detection signal of the thermocouple 27. An electrode 28 is embedded in the susceptor 22 in the vicinity of a surface thereof, and the electrode 28 is grounded. Further, three wafer supporting pins (not shown) for supporting and elevating the wafer W are installed in the susceptor 22, and they can be protruded from and retracted into the surface of the susceptor 22.

A shower head 30 is installed at a ceiling wall 21a of the chamber 21 via an insulating member 29. The shower head 30 is formed in a cylindrical shape and has a gas diffusion space 39 therein. Further, a gas inlet opening 31 for introducing a processing gas is provided at a top surface of the shower head 30, and a plurality of gas discharge openings 32 is provided at a bottom surface thereof. The gas inlet opening 31 of the shower head 30 is connected to a gas supply mechanism 34 for supplying the processing gas for forming an amorphous carbon film via a gas pipe 33.

The shower head 30 is connected to a high frequency power supply 36 via a matching unit 35. Accordingly, a high frequency power is supplied to the shower head 30 from the high frequency power supply 36. By supplying the high frequency power from the high frequency power supply 36, the gas supplied into the chamber 21 through the shower head 30 can be excited into plasma.

A gas exhaust pipe 37 is installed at a bottom wall 21b of the chamber 21. The gas exhaust pipe 37 is connected to a gas exhaust unit 38 including a vacuum pump. By operating the gas exhaust unit 38, the inside of the chamber can be depressurized to a certain vacuum level. Installed at a sidewall of the chamber 21 are a loading/unloading port 40 through which the W is loaded and unloaded; and a gate valve 41 for opening and closing the loading/unloading port 40.

Respective components of the amorphous carbon film forming apparatus 101 such as the heater power supply 26, the gas supply mechanism 34, the high frequency power supply 36, the gas exhaust unit 38 and the like are connected to an apparatus controller 42. The apparatus controller 42 is connected to the process controller 111. With this configuration, the apparatus controller 42 controls each component of the amorphous carbon film forming apparatus 101 in response to an instruction from the process controller 111.

Hereinafter, an amorphous carbon film forming process, which is performed by using the amorphous carbon film forming apparatus 101, will be explained.

A W having a structure as shown in FIG. 1D is loaded into the chamber 21 and mounted on the susceptor 22. Then, a plasma generating gas, e.g., an Ar gas, flows from the gas supply mechanism 34 via the gas pipe 33 and the shower head 30. At the same time, the inside of the chamber 21 is exhausted by the gas exhaust unit 38 and maintained in a certain depressurized state. Further, the susceptor 22 is heated to a certain temperature in a range of about 100 to 200° C. by the heater 25. Further, as a high frequency power is applied to the shower head 30 from the high frequency power supply 36, a high frequency electric field is generated between the shower head 30 and the electrode 28, and the plasma generating gas is excited into plasma.

In this state, a processing gas containing a hydrocarbon gas for forming an amorphous carbon film is introduced into the chamber 21 from the gas supply mechanism 34 via the gas pipe 33 and the shower head 30.

Accordingly, the processing gas is excited by the plasma generated in the chamber 21 and is heated and decomposed on the wafer W. As a result, as shown in FIG. 1E, an amorphous carbon film 7 is thinly formed. In this case, the thickness of the amorphous carbon film 7 is desirably equal to or less than about 5 nm, and more desirably, it may be in a range of about 1 to 5 nm.

Particularly, a gaseous mixture of acetylene and hydrogen gas may be used as the processing gas containing the hydrocarbon gas. Alternatively, a gas having a chemical formula of $C_4H_6$ can also be utilized. In such a case, a compound such as 2-butyne or butadiene may be used. Further, the processing gas may contain a nonreactive gas such as an Ar gas or the like.

Further, it is desirable that a pressure inside the chamber during the formation of the amorphous carbon film is equal to or less than about 2.7 Pa (20 mTorr).

Furthermore, it is desirable that a wafer temperature (film forming temperature) during the formation of the amorphous carbon film is about 200° C. or less, and more desirably, about 100 to 200° C.

Frequency and power of the high frequency power applied to the shower head 30 can be appropriately set depending on a required level of reactivity. By applying the high frequency power, a high frequency electric field is generated within the chamber 21, whereby the processing gas can be excited into the plasma. Accordingly, the amorphous carbon film can be formed by plasma CVD. Since the gas excited into the plasma has a high reactivity, it is possible to further reduce the film forming temperature. Further, the plasma source is not limited to a capacitively coupled type using the high frequency power as stated above, but it may be an inductively coupled type or may be a type which generates plasma by introducing a microwave into the chamber 21 through a waveguide and an antenna. Furthermore, a plasma generation is not essential and it may be possible to employ a film formation by thermal CVD when the reactivity is sufficiently high.

The amorphous carbon film formed by the above-described process is a $CH_X$ film (0.8<x<1.2), which is made of carbon and hydrogen, and has a high adhesivity to a presently existing low-k interlayer insulating film and a metal such as Cu or the like. Furthermore, as for conventionally employed SiN, SiC, and SiCN films, though their dielectric constants can be lowered by increasing a ratio of pores contained in the films, a barrier property for preventing the diffusion of Cu may be deteriorated in such a case. In contrast, since the amorphous carbon film formed in accordance with the present embodiment is a dense bulk film having no pores therein, it has a high barrier property as well as a low dielectric constant. Thus, even if its film thickness is equal to or less than about 5 nm, a barrier function can still be exerted.

Now, a second embodiment of the present invention will be explained.

In a manufacturing process of a semiconductor device, a heat treatment such as an annealing process is frequently performed after forming a film so as to prevent a deterioration of each layer (film), a change in size thereof, or the like, or to meet the demands of a process.

However, it was demonstrated that, when an amorphous carbon film is formed directly on a surface of a Cu wiring layer, the thickness of the amorphous carbon film is decreased if the heat treatment such as an annealing process is performed at a temperature over a preset value.

Below, an experiment for confirming such a film thickness decrease will be explained.

Figure 4:
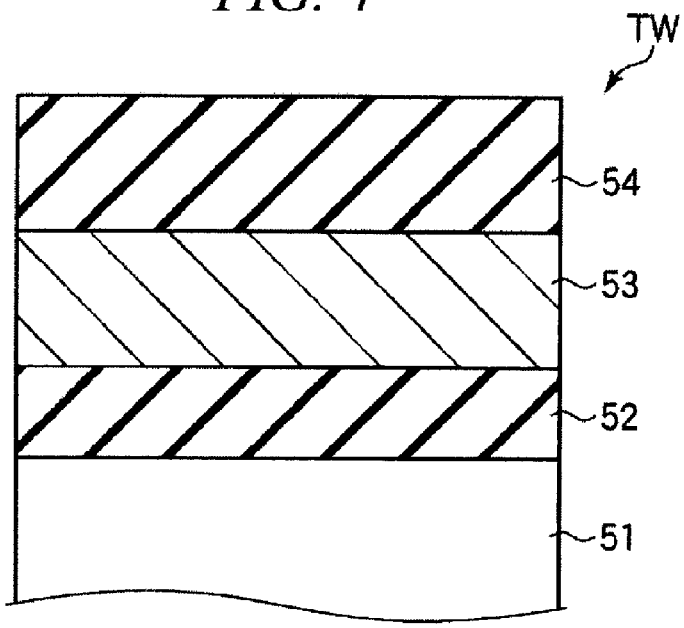
FIG. 4 is a cross sectional view of a test wafer used in an experiment upon a decrease of an amorphous carbon film thickness when the amorphous carbon film is directly formed on a Cu wiring layer.
Figure 5:
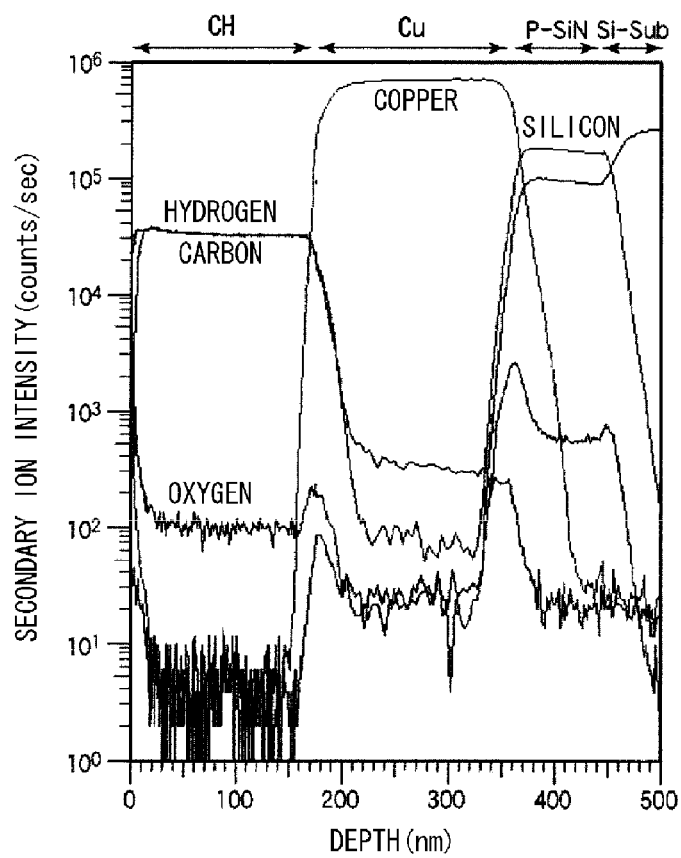
FIG. 5 is a diagram showing a SIMS profile in a depth direction before performing an annealing process on the test wafer of FIG. 4.
Figure 6:
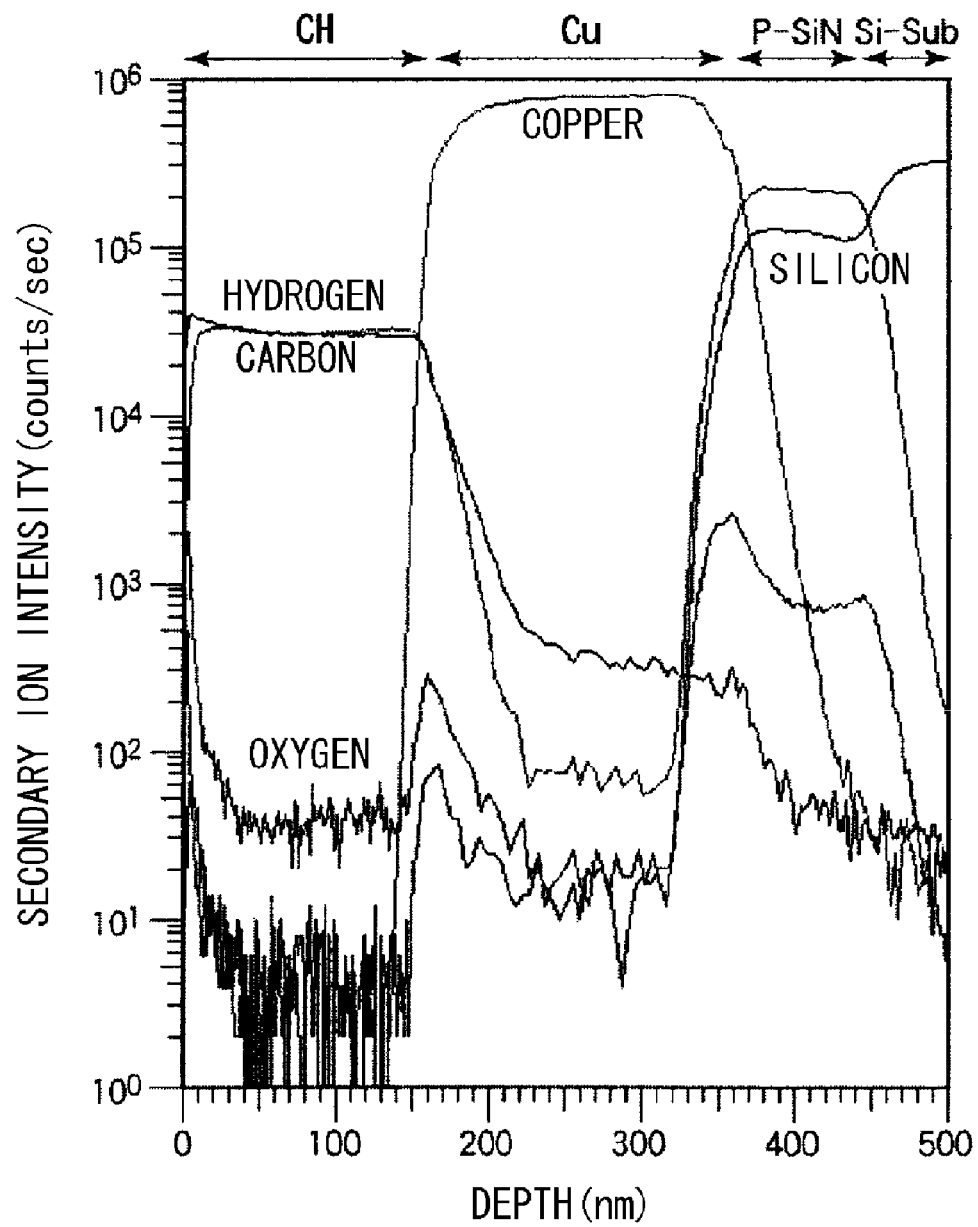
FIG. 6 is a diagram showing a SIMS profile after performing an annealing process on the test wafer of FIG. 4 at about 350° C.

FIG. 4 shows a structure of a test wafer used in a heat treatment test of an amorphous carbon film. As illustrated in FIG. 4, a test wafer TW was prepared by using a Si substrate 51 as a base and forming a P-SiN film 52, a Cu film 53 and an amorphous carbon film 54 on the Si substrate 51 in sequence. Measurement by a SIMS (Secondary Ion Mass Spectrometry) was conducted for the test wafer TW before performing an annealing process and after performing an annealing process at about 350° C. and 400° C., respectively. FIG. 5 shows a measurement result before the annealing process; FIG. 6, a measurement result after the annealing process at about 350° C.; and FIG. 7, a measurement result after the annealing process at about 400° C.

Referring to FIGS. 5 and 6, the thickness-direction profiles of the Cu and the carbon hardly changed after the annealing process at about 350° C., in comparison with those before the annealing process. From this result, it was found that the thicknesses of the Cu film 53 and the amorphous carbon film 54 hardly change after the annealing process at about 350° C.

Figure 7:
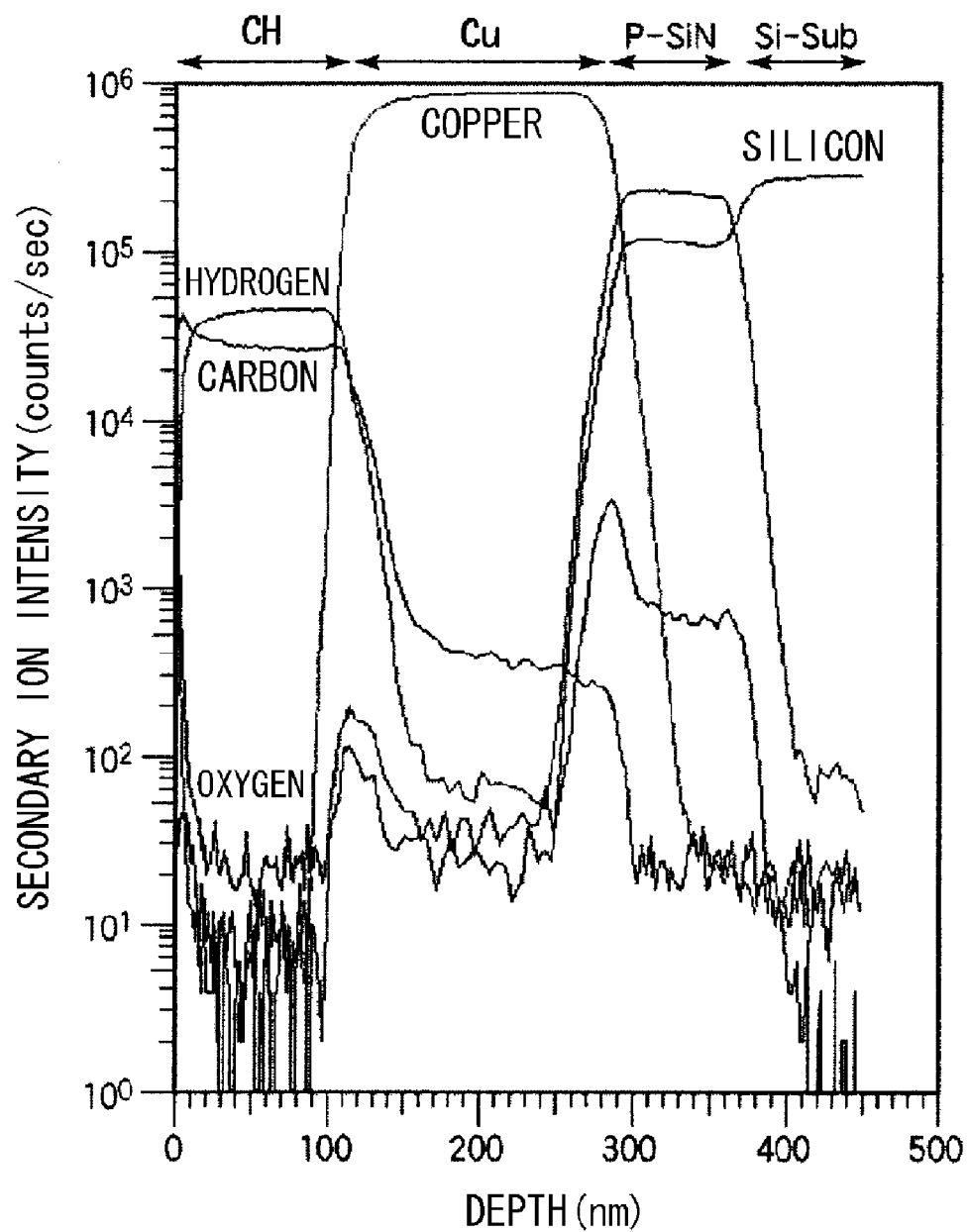
FIG. 7 is a diagram showing a SIMS profile after performing an annealing process on the test wafer of FIG. 4 at about 400° C.

In contrast, referring to FIGS. 5 and 7, though the thickness-direction profile of the Cu was not readily changed after the annealing process at about 400° C. as compared to that before the annealing process, the thickness-direction profile of the carbon was changed. To be more specific, secondary ion intensity of a portion corresponding to the amorphous carbon film was remarkably decreased. From this result, it was found that the thickness of the amorphous carbon film 54 was decreased. That is, it was demonstrated that, when the annealing process is performed at about 400° C., the amorphous carbon film is reduced, though the Cu diffusion can be prevented by the amorphous carbon film.

In the second embodiment of the present invention, a means for preventing the film thickness decrease will be considered.

Figure 8:
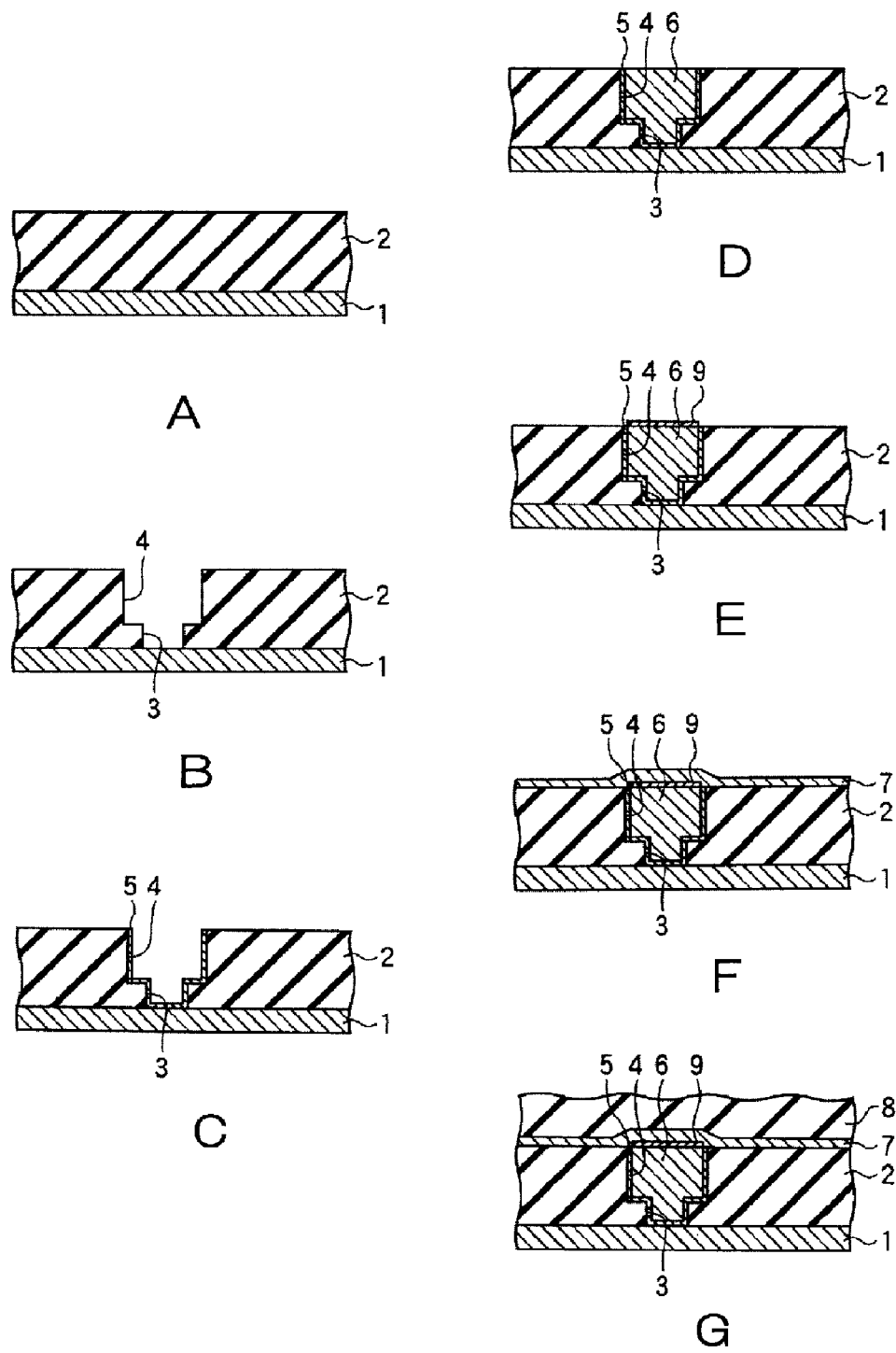
FIGS. 8A to 8G are process diagrams for describing a semiconductor device manufacturing method in accordance with a second embodiment of the present invention.

FIGS. 8A to 8G are process diagrams for describing a semiconductor device manufacturing method in accordance with the second embodiment of the present invention. In the present embodiment, after a Cu wiring layer 6 is formed as shown in FIGS. 8A to 8D, just like in FIGS. 1A to 1D, a metal film 9 is selectively formed on a surface of the Cu wiring layer 6, as illustrated in FIG. 8E. Then, as in the first embodiment, an amorphous carbon film 7 is formed (FIG. 8F), and a low-k film 8 is additionally formed thereon, so that a structure set forth in FIG. 8G is obtained.

As in the present embodiment, if the metal film 9 is interleaved between the Cu wiring layer 6 and the amorphous carbon film 7, the thickness of the amorphous carbon film 7 can be prevented from being decreased even in case that a heat treatment is performed at a temperature of 400° C. or more.

The metal film 9 can be obtained by thinly forming a metal having selectivity by selective plating or selective CVD. Alternatively, the metal film 9 can also be formed by sputtering a metal onto the entire surface of the wafer W including the Cu wiring layer 6 by PVD; and then performing heat treatment so as to make an alloy of the metal and the Cu wiring layer; and then removing an unalloyed portion by wet etching or the like. The thickness of the metal film 9 is desirably in a range of about 1 to 5 nm, and more desirably, in a range of about 2 to 5 nm.

At least one of Co, Ni, W, Al, In, Sn, Mn, Zn and Zr can be used as the metal having the selectivity when forming the metal film 9. When the metal film 9 is formed by the selective plating, Co, Ni or W may be used. When the plating process is an electroless plating process, a reducing agent such as B, P, or the like may be included in such metals. Meanwhile, when the metal film 9 is formed by the selective CVD, Al or W can be utilized.

As for the alloying process, for example, if Al, In, Sn, Mn, Zn and Zr are used as the particular metal, alloys of $CuAl_2$, $CuIn_2$, $CuSn_2$, $CuMn_2$, $CuZn$ and $CuZr_2$ may be generated, respectively.

Figure 9:
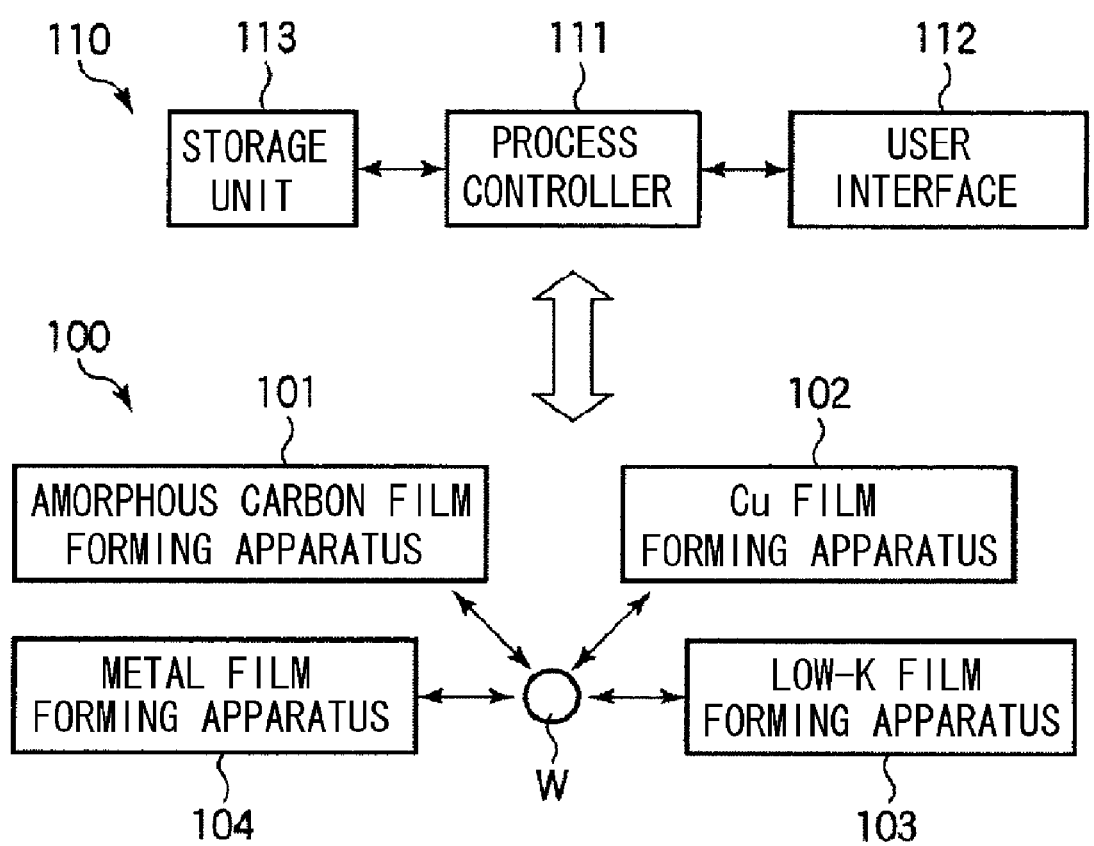
FIG. 9 is a schematic configuration view of a semiconductor device manufacturing system used in the semiconductor device manufacturing method in accordance with the second embodiment of the present invention.

Now, an example system for implementing the method in accordance with the second embodiment will be explained. FIG. 9 is a schematic configuration view of a semiconductor device manufacturing system used in the semiconductor device manufacturing method in accordance with the second embodiment of the present invention. In this semiconductor device manufacturing system, a processing unit 100 includes a metal film forming apparatus 104 in addition to an amorphous carbon film forming apparatus 101, a Cu film forming apparatus 102 and a low-k film forming apparatus 103.

Figure 2:
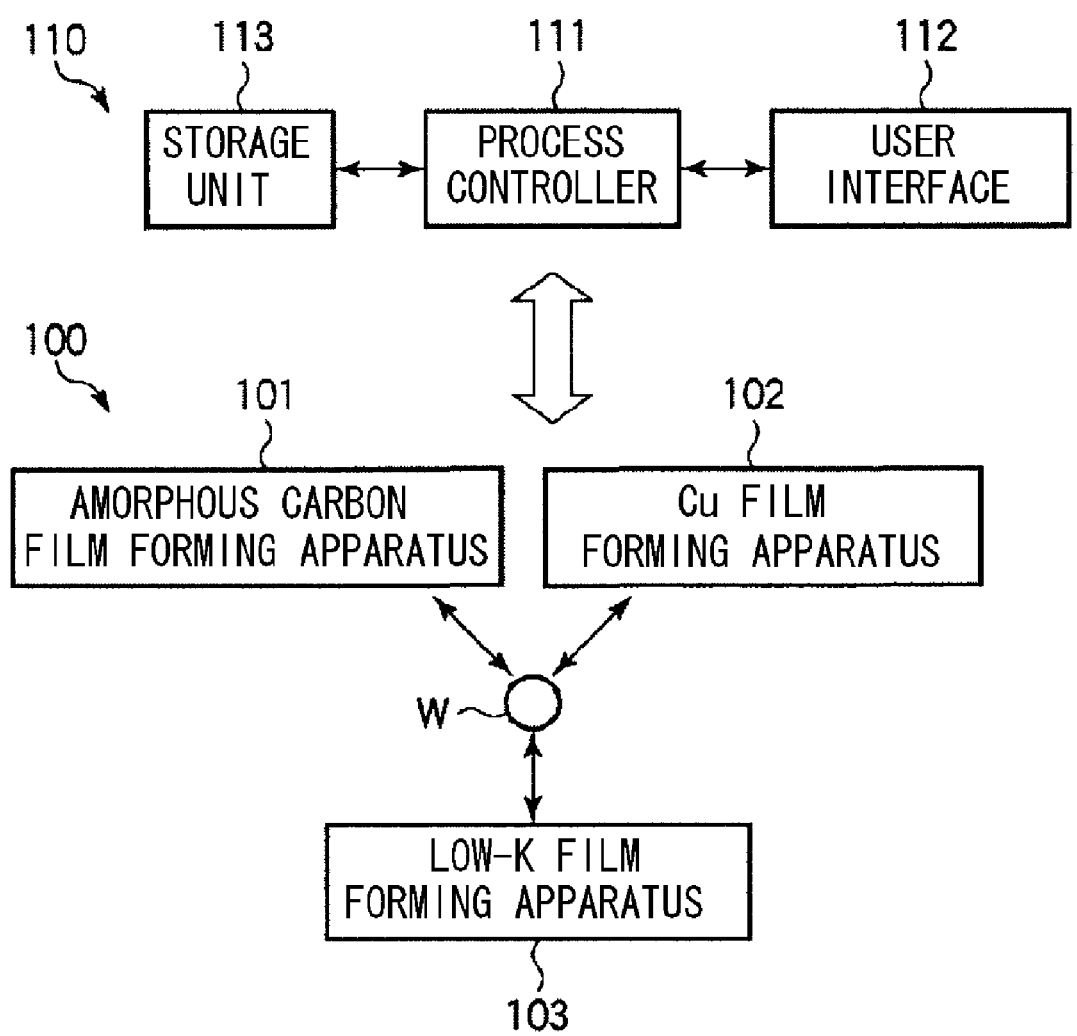
FIG. 2 is a schematic configuration view of a semiconductor device manufacturing system used in the semiconductor device manufacturing method in accordance with the first embodiment of the present invention.

Except for having the metal film forming apparatus 104, the processing system of FIG. 9 has the same configuration as that of the processing system of FIG. 2.

The metal film forming apparatus 104 is an apparatus for selectively forming a metal film on a Cu wiring layer. A plating apparatus for forming the metal film by plating or a CVD apparatus for forming the metal film by CVD can be used as the metal film forming apparatus 104. In case of making an alloy of the metal film and the Cu wiring layer, an apparatus additionally including a PVD apparatus for forming the metal film; a heat treating apparatus for applying heat for alloying; and a removing apparatus such as a wet etching apparatus for removing an unalloyed portion may be utilized.

Now, a third embodiment of the present invention will be explained.

Figure 10:
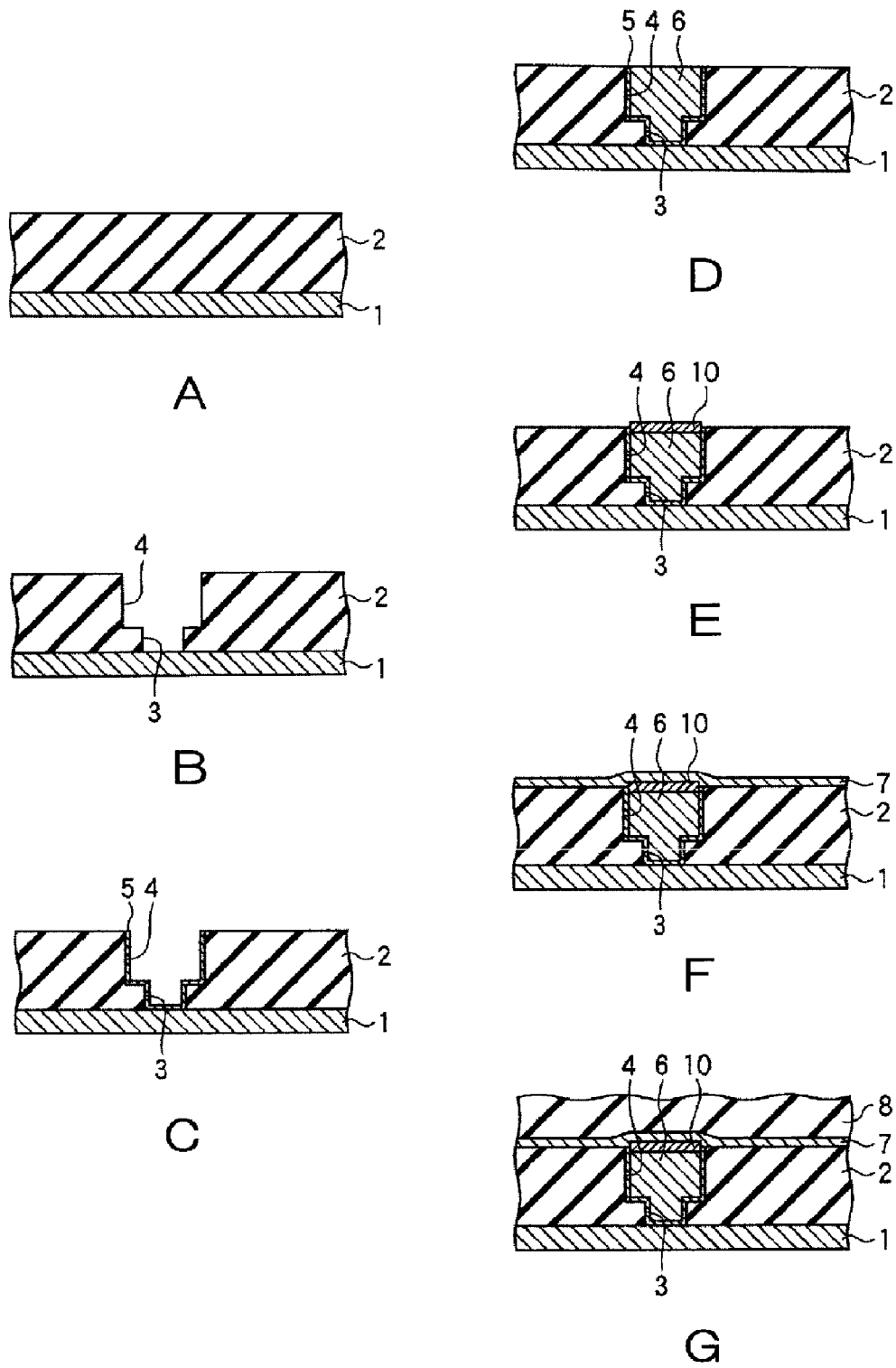
FIGS. 10A to 10G are process diagrams for describing a semiconductor device manufacturing method in accordance with a third embodiment of the present invention.

In the present embodiment, a silicide film 10 is formed instead of the metal film 9 of the second embodiment in order to prevent the film thickness decrease. FIGS. 10A to 10G are process diagrams for describing a semiconductor device manufacturing method in accordance with the third embodiment of the present invention. In the present embodiment, a Cu wiring layer 6 is formed as shown in FIGS. 10A to 10D, just like in FIGS. 8A to 8D of the second embodiment. Thereafter, the silicide film ($Cu_5Si$) 10 is selectively formed on a surface of the Cu wiring layer 6, as illustrated in FIG. 10E.

In the formation of the silicide film 10, by supplying a Si-containing gas onto the surface of the Cu wiring layer 6, Si is diffused on the surface of the Cu wiring layer 6. Accordingly, Cu and Si react with each other, so that a silicide film made of $Cu_5Si$ is formed. The Si-containing gas can be appropriately selected from a $SiH_4$ (silane) gas, a $Si_2H_6$ (disilane) gas, a $Si(CH_3)_4$ (tetramethylsilane) gas, a $SiH(CH_3)_3$ (trimethylsilane) gas, a $SiH_2(CH_3)_2$ (dimethylsilane) gas, a $SiH_3(CH_3)$ (monomethylsilane) gas, and a $(SiH_3)_3N$ (trisilylamine) gas. Especially, the $(SiH_3)_3N$ gas is desirable because it has a good reactivity.

The above-stated formation process of the silicide film 10 can be performed at a substrate temperature in a range of, e.g., about 150 to 200° C. The thickness of the silicide film 10 is desirably equal to or less than about 100 nm, and it is desirable to minimize the thickness of the silicide film 10 as long as a desired effect can be obtained. More desirably, the thickness of the silicide film 10 is set to be in a range of about 5 to 20 nm, and still more desirably, about 5 to 10 nm.

The silicide film 10 has a higher selectivity with respect to the Cu wiring layer 6 than the metal film 9. That is, the silicide film 10 is hardly formed on a portion of the low-k film 2 where the Cu wiring layer 6 is not formed. Accordingly, a process (trouble) for removing an unnecessary silicide film can be omitted. Furthermore, the use of the silicide film 10 is also advantageous in that, as mentioned above, the formation of the silicide film 10 can be performed at about 150 to 200° C., which is lower than the processing temperature for the formation of the metal film 9. In addition, the silicide film 10 generates an oxide as it reacts with oxygen of an oxide (CuO) presently existing in the Cu wiring layer 6 in a very small amount. This blocks the oxygen from diffusing to the outside from the Cu wiring layer 6, which is also deemed as an advantage of using the silicide film 10.

Therefore, it is more advantageous to form the silicide film 10 on the Cu wiring layer 6 as in the present embodiment than to form the metal film 9 as in the second embodiment.

Figure 11:
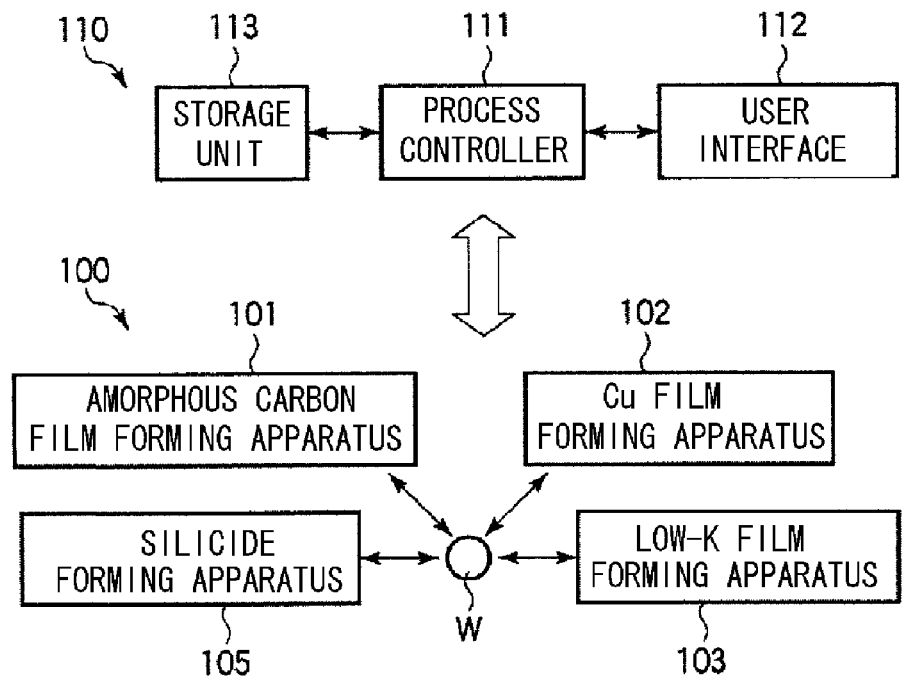
FIG. 11 is a schematic configuration view of a semiconductor device manufacturing system used in the semiconductor device manufacturing method in accordance with the third embodiment of the present invention.

Now, an example system for implementing the semiconductor device manufacturing method in accordance with the third embodiment will be described. FIG. 11 is a schematic configuration view of a semiconductor device manufacturing system used in the semiconductor device manufacturing method in accordance with the third embodiment of the present invention. In this semiconductor device manufacturing system, a processing unit 100 includes a silicide forming apparatus 105 in addition to an amorphous carbon film forming apparatus 101, a Cu film forming apparatus 102 and a low-k film forming apparatus 103. Except for having the silicide forming apparatus 105, the processing system of FIG. 11 has the same configuration as that of the processing system of FIG. 2.

As described above, the silicide forming apparatus 105 is an apparatus for supplying a Si-containing gas onto the surface of the Cu wiring layer 6 while heating the wafer at a temperature of, desirably, about 150 to 200° C. The Si-containing gas such as a silane ($SiH_4$) gas has a high reactivity. Thus, as stated above, by heating the wafer at about 150 to 200° C., it is possible to form the silicide film 10 only by supplying the gas without having to use plasma or the like.

Figure 12:
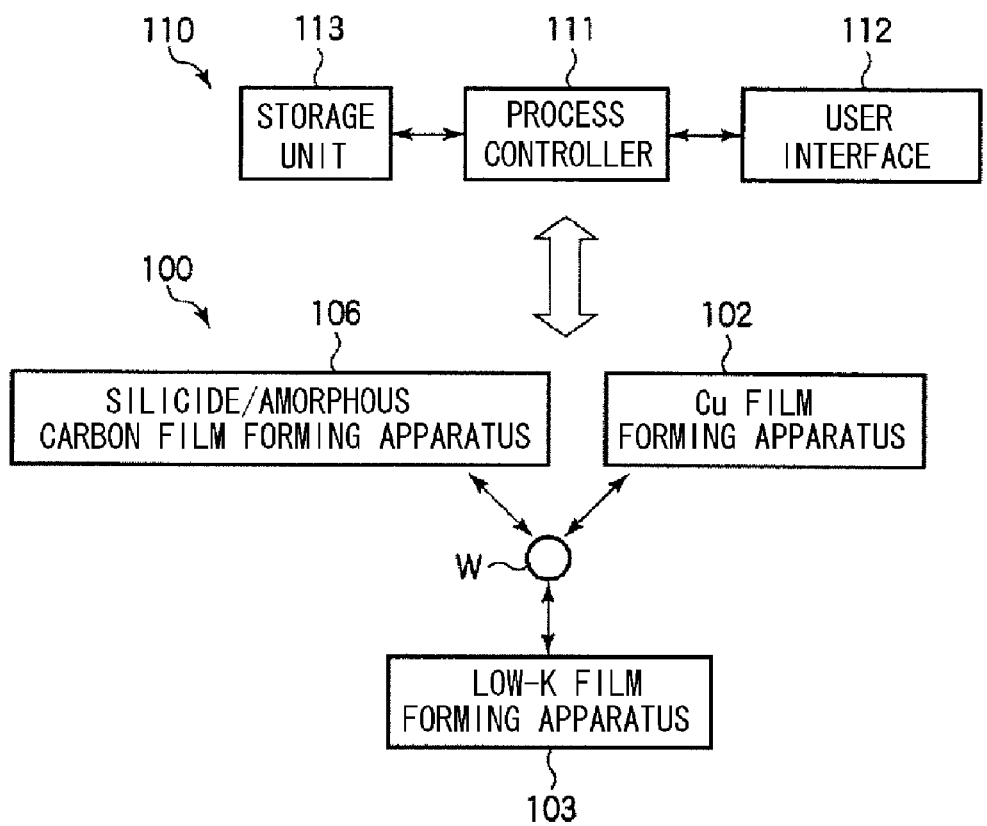
FIG. 12 is a schematic configuration view of another example of a semiconductor device manufacturing system used in the semiconductor device manufacturing method in accordance with the third embodiment of the present invention.

As mentioned, with the silicide forming apparatus 105, it is possible to form the silicide only by introducing the Si-containing gas. Therefore, besides installing it as an independent apparatus, it is also possible to provide a silicide/amorphous carbon film forming apparatus 106 by adding a Si-containing gas introducing function to the amorphous carbon film forming apparatus 101, as illustrated in FIG. 12. In such a case, the formation of a silicide film can be carried out just by supplying a Si-containing gas while setting a processing temperature to be about 200° C. or below, which is the same temperature as that for the formation of an amorphous carbon film. That is, if it is configured to allow the Si-containing gas such as the $SiH_4$ gas and a gas for forming an amorphous carbon film such as a $C_4H_6$ gas to be supplied into the chamber, the silicide formation and the amorphous carbon film formation can be carried out in-situ while maintaining a vacuum state.

Figure 13:
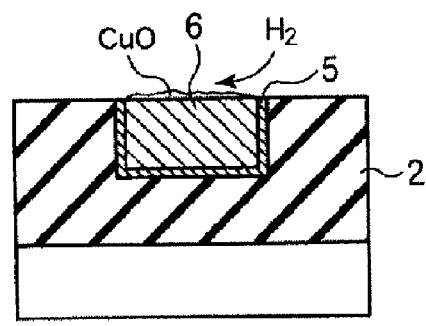
FIGS. 13A to 13C are process diagrams for illustrating a removal of a native oxide film, a formation of a silicide film and a formation of an amorphous carbon film.
Figure 13:
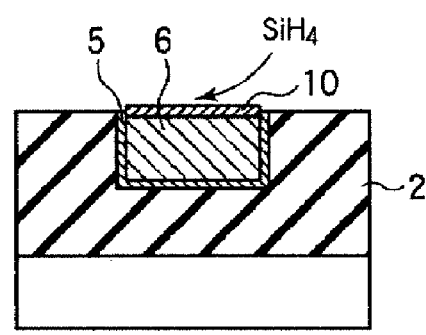
Figure 13:
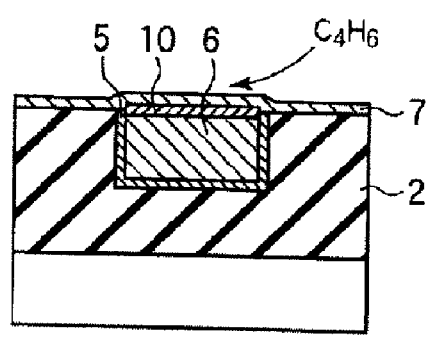

In this case, if a removal of a native oxide film is performed by using a reduction gas such as a $H_2$ gas, as shown in FIGS. 13A to 13C, the removal of the native oxide film (FIG. 13A), the formation of the silicide film 10 (FIG. 13B), and the formation of the amorphous carbon film 7 (FIG. 13C) can be carried out only by changing the kind of gases. Further, all of these processes can be performed at a temperature equal to or less than about 200° C.

Especially, it is very desirable to set the silicide/amorphous carbon film forming apparatus 106 to have a reduction gas supply function because, in such a case, all these processes can be performed in-situ while maintaining a vacuum state.

Figure 14:
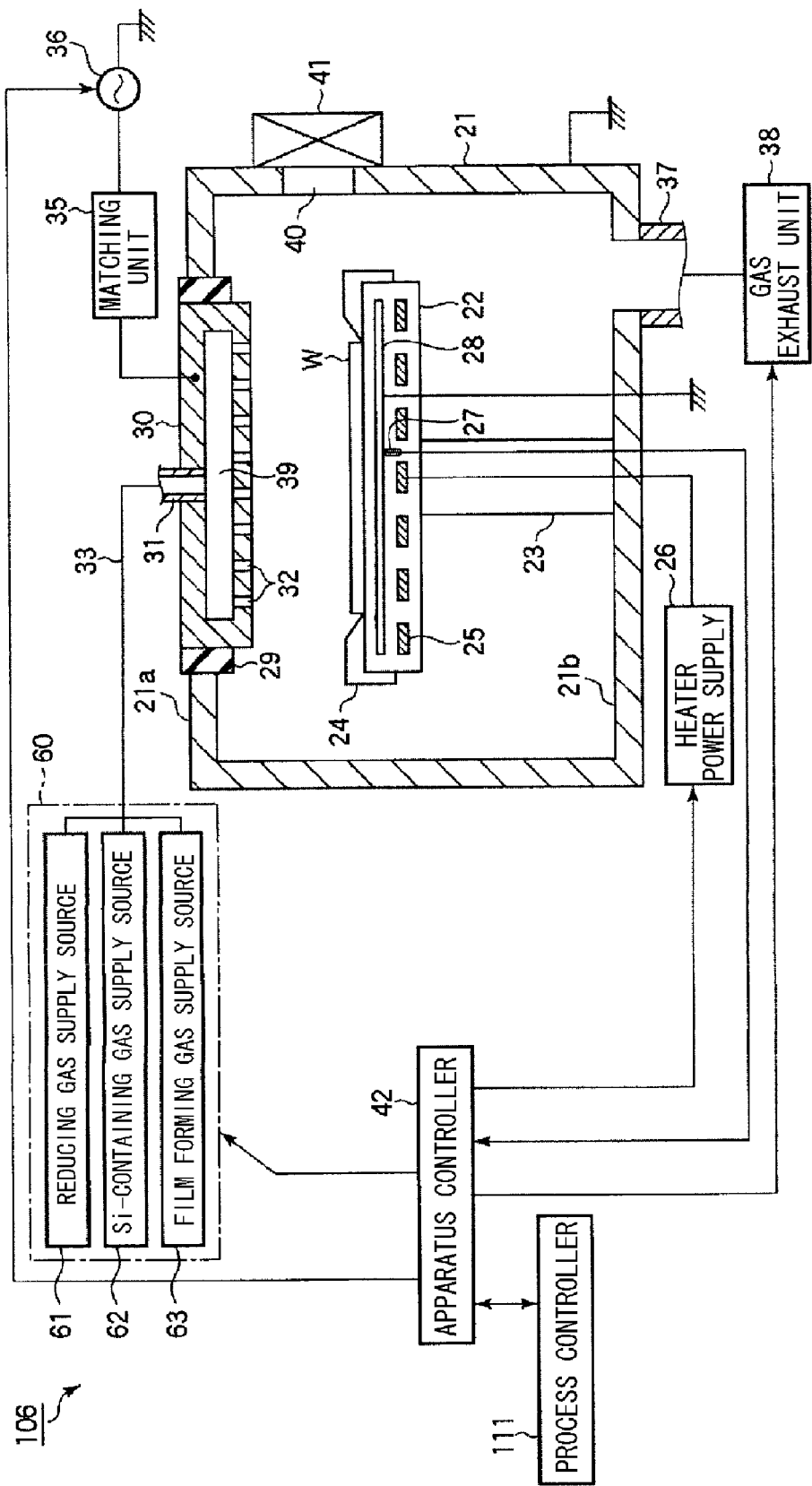
FIG. 14 is a schematic configuration view of an apparatus capable of performing the removal of the native oxide film, the formation of the silicide film and the formation of the amorphous carbon film in the same chamber.

FIG. 14 illustrates the silicide/amorphous carbon film forming apparatus 106 having the reduction gas supply function. The basic configuration of this apparatus is the same as that of the amorphous carbon film forming apparatus shown in FIG. 3. Thus, like parts will be assigned like reference numerals, and redundant description thereof will be omitted.

The silicide/amorphous carbon film forming apparatus 106 of FIG. 14 includes a gas supply mechanism 60 having a reduction gas supply source 61 for supplying the reduction gas as described above; a Si-containing gas supply source 62 for supplying the Si-containing gas as stated above; and a film forming gas supply source 63 for supplying the gas for forming the amorphous carbon film as described above. By supplying a reduction gas such as a $H_2$ gas from the reduction gas supply source 61 into a chamber 21 via a gas pipe 33 and a shower head 30, a native oxide film of a Cu wiring layer on a surface of a wafer can be removed. Then, by supplying a $SiH_4$ gas or the like into the chamber from the Si-containing gas supply source 62 via the gas pipe 33 and the shower head 30, a silicide film is formed on a clean surface of the Cu wiring layer. Thereafter, by introducing a processing gas containing a hydrocarbon gas for forming an amorphous carbon film into the chamber 21 from the film forming gas supply source 63 via the gas pipe 33 and the shower head 30, an amorphous carbon film is formed on the silicide film.

By using this apparatus, the removal of the native oxide film, the formation of the silicide film and the formation of the amorphous carbon film can be performed in the same chamber.

However, even when it is desired to perform the processes in-situ while maintaining a vacuum state (without breaking a vacuum), the respective processes need not necessarily be performed in a single chamber, but there can be employed a multi-chamber type apparatus having a plurality of processing chambers for performing the respective processes separately.

When the silicide/amorphous carbon film forming apparatus 106 does not have the reduction gas supply function, the formation of the silicide film and the formation of the amorphous carbon film can be performed consecutively by the silicide/amorphous carbon film forming apparatus 106 after the native oxide film on the Cu wiring layer 6 is removed by an appropriate native oxide film removing apparatus.

Here, it should be noted that the present invention is not limited to the embodiments described above, but various changes and modifications may be made. For example, though selective plating or a CVD method is used when forming a thin metal film in the embodiments, it is not limited thereto, and other methods can be employed as long as a thin metal film can be formed. Moreover, though the semiconductor wafer is used as the target substrate to be processed, it is not limited thereto, and the present invention can also be applied to another kind of substrate, e.g., a glass substrate for a flat panel display (FPD) such as a liquid crystal display (LCD).

What is claimed is:

1. A semiconductor device manufacturing method comprising:
   forming a wiring layer made of copper or a copper alloy on a substrate;
   forming a metal film on the wiring layer;
   forming, on the metal film, an amorphous carbon film as a copper diffusion barrier film by CVD using a processing gas containing a hydrocarbon gas; and
   forming a low-k insulating film on the copper diffusion barrier film,
   wherein the process of forming the metal film is performed to suppress a thickness decrease of the amorphous carbon film in case that a heat treatment is performed on the semiconductor device.

2. The semiconductor device manufacturing method of claim 1, wherein the metal film is formed to have a thickness ranging from about 1 to 5 nm.

3. The semiconductor device manufacturing method of claim 1, wherein the metal film forms an alloy with the underlying wiring layer.

4. The semiconductor device manufacturing method of claim 1, wherein the metal film contains at least one of Co, Ni, W, Al, In, Sn, Mn, Zn and Zr.

5. The semiconductor device manufacturing method of claim 1, wherein the metal film is formed by a plating process or a CVD process.

6. The semiconductor device manufacturing method of claim 5, wherein the metal film is formed by a plating process and contains at least one of W, Co and Ni.

7. The semiconductor device manufacturing method of claim 5, wherein the metal film is formed by a CVD process and contains at least one of W and Al.

8. The semiconductor device manufacturing method of claim 1, further comprising:
   removing an oxide film on a surface of the wiring layer.

9. The semiconductor device manufacturing method of claim 1, wherein the amorphous carbon film is formed to allow the copper diffusion barrier film to have a thickness equal to or less than about 5 nm.

10. The semiconductor device manufacturing method of claim 1, wherein the processing gas contains an acetylene gas and a hydrogen gas.

11. The semiconductor device manufacturing method of claim 1, wherein the processing gas contains a gas having a chemical formula of $C_4H_6$.

12. The semiconductor device manufacturing method of claim 11, wherein the gas having the chemical formula of $C_4H_6$ is at least one of 2-butyne and butadiene.

13. A semiconductor device manufacturing method comprising:
    forming a wiring layer made of copper or a copper alloy on a substrate;
    forming, on the wiring layer, a silicide film through a reaction between the copper in the wiring layer and silicon by supplying a silicon-containing gas;
    forming, on the silicide film, an amorphous carbon film as a copper diffusion barrier film by CVD using a processing gas containing a hydrocarbon gas; and
    forming a low-k insulating film on the copper diffusion barrier film,
    wherein the process of forming the silicide film is performed to suppress a thickness decrease of the amorphous carbon film in case that a heat treatment is performed on the semiconductor device.

14. The semiconductor device manufacturing method of claim 13, wherein the silicide film is formed to have a thickness equal to or less than about 100 nm.

15. The semiconductor device manufacturing method of claim 13, wherein the silicon-containing gas is selected from a group consisting of a $SiH_4$ gas, a $Si_2H_6$ gas, a $Si(CH_3)_4$ gas, a $SiH(CH_3)_3$ gas, a $SiH_2(CH_3)_2$ gas, a $SiH_3(CH_3)$ gas and a $(SiH_3)_3N$ gas.

16. The semiconductor device manufacturing method of claim 13, wherein each of the process of forming the silicide film and the process of forming the amorphous carbon film is implemented by a vacuum processing, and a vacuum state is maintained between the process of forming the silicide film and the process of forming the amorphous carbon film.

17. The semiconductor device manufacturing method of claim 16, wherein the process of forming the silicide film and the process of forming the amorphous carbon film are performed in the same chamber.

18. A semiconductor device manufacturing method comprising:
    forming a wiring layer made of copper or a copper alloy on a substrate;
    removing an oxide film on a surface of the wiring layer;
    forming, on the wiring layer, a silicide film by a reaction between the copper in the wiring layer and silicon by way of supplying a silicon-containing gas; and
    forming, on the silicide film, an amorphous carbon film as a copper diffusion barrier film by CVD using a processing gas containing a hydrocarbon gas,
    wherein all of the processes are implemented by a vacuum processing, and a vacuum state is maintained between the processes, and the process of forming the silicide film is performed to suppress a thickness decrease of the amorphous carbon film in case that a heat treatment is performed on the semiconductor device.

19. The semiconductor device manufacturing method of claim 18, wherein the process of removing the oxide film on the surface of the wiring layer, the process of forming the silicide film and the process of forming the amorphous carbon film are performed in the same chamber.

* * * * *

UNITED STATES PATENT AND TRADEMARK OFFICE
CERTIFICATE OF CORRECTION

PATENT NO. : 8,017,519 B2
APPLICATION NO. : 12/521397
DATED : September 13, 2011
INVENTOR(S) : Hiraku Ishikawa It is certified that error appears in the above-identified patent and that said Letters Patent is hereby corrected as shown below:

Column 1, line 29, replace "asking" with -- ashing --

Column 8, line 23, insert -- 21 -- between "chamber" and "can"

Column 8, line 26, insert -- wafer -- between "the" and "W"

Column 8, line 40, insert -- wafer -- between "A" and "W"

Signed and Sealed this
Third Day of January, 2012

David J. Kappos
*Director of the United States Patent and Trademark Office*